(12) United States Patent
Theuss

(10) Patent No.: US 7,566,585 B2
(45) Date of Patent: Jul. 28, 2009

(54) SEMICONDUCTOR COMPONENT AND METHOD FOR PRODUCTION OF A SEMICONDUCTOR COMPONENT

(75) Inventor: Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 11/552,702

(22) Filed: Oct. 25, 2006

(65) Prior Publication Data

US 2007/0092992 A1    Apr. 26, 2007

(51) Int. Cl.
*H01L 21/44*    (2006.01)

(52) U.S. Cl. .................. 438/106; 438/455; 438/460; 438/643; 438/683; 257/591; 257/607; 257/686; 257/723; 257/773; 257/E21.165

(58) Field of Classification Search .............. 438/683; 257/591, 607

See application file for complete search history.

(56) References Cited

U.S. PATENT DOCUMENTS 5,964,942 A  * 10/1999  Tanabe et al. ............. 117/87

6,893,936 B1    5/2005  Chen et al.
2001/0049155 A1* 12/2001  Yamaji ..................... 438/106
2003/0017626 A1*  1/2003  Hilt et al. .................. 438/3

FOREIGN PATENT DOCUMENTS

DE    102004007690    10/2005
WO    2005078794      8/2005

* cited by examiner

*Primary Examiner*—Thao X Le
*Assistant Examiner*—Kyoung Lee
(74) *Attorney, Agent, or Firm*—Dicke, Billig, Czaja PLLC

(57) ABSTRACT

A semiconductor substrate, a semiconductor chip and a semiconductor component with areas composed of a stressed monocrystalline material, and a method for production of a semiconductor component is disclosed. In one embodiment, the semiconductor chip includes relatively thick stressed layers achieving reduced switching times. For this purpose, the semiconductor substrate has one or more areas with extrinsic, permanent curvature, with the crystal structure K being compressed and/or widened and/or distorted in these areas.

16 Claims, 2 Drawing Sheets

SEMICONDUCTOR COMPONENT AND METHOD FOR PRODUCTION OF A SEMICONDUCTOR COMPONENT

CROSS-REFERENCE TO RELATED APPLICATIONS

This Utility Patent Application claims priority to German Patent Application No. DE 10 2005 051 332.8 filed on Oct. 25, 2005, which is incorporated herein by reference.

BACKGROUND

The invention relates to a semiconductor substrate, a semiconductor chip and a semiconductor component with areas composed of a stressed monocrystalline material, and to a method for production of a semiconductor component such as this.

Layers composed of stressed silicon are used in semiconductor technology in order to achieve shorter switching times for semiconductor components. Stressed silicon has a distorted crystal lattice with a different lattice constant to that of relaxed silicon. The multiple degeneracy of the valence band minima in the relaxed state is overcome, so that the effective mass of the charge carriers, which contributes to the current flow, falls, and their mobility thus increases. This effect can be used to shorten the switching times of a semiconductor component.

Stressed silicon is conventionally produced by growing silicon layers onto SiGe layers. Conversely, it is also possible to produce stressed SiGe layers on relaxed Si. Germanium has the same crystal structure as silicon, but a lattice constant that is 4.2% greater. When a silicon layer is epitaxially grown on an SiGe layer, lattice mismatches in the silicon lead to the desired stresses.

However, epitaxy cannot be used to produce silicon layers of any desired thickness and with any desired stress magnitude. Beyond a thickness of a plurality of layers or beyond a germanium component of more than 20% in the SiGe layer, stresses are dissipated by the formation of displacements which lead to undesirable scattering effects, or else the layers which are formed are metastable, so that displacements occur when the material is heated in subsequent processes. Epitaxial growing of silicon onto SiGe can thus achieve only restricted stressing of the silicon, with a limited layer thickness.

For these and other reasons, there is a need for the present invention.

SUMMARY

One embodiment of the invention provides a semiconductor substrate, a semiconductor chip and a semiconductor component with areas composed of a stressed monocrystalline material, and a method for production of a semiconductor component. In one embodiment, a semiconductor chip has relatively thick stressed layers achieving reduced switching times. The semiconductor substrate has one or more areas with extrinsic, permanent curvature, the crystal structure K being compressed and/or widened and/or distorted in these areas.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
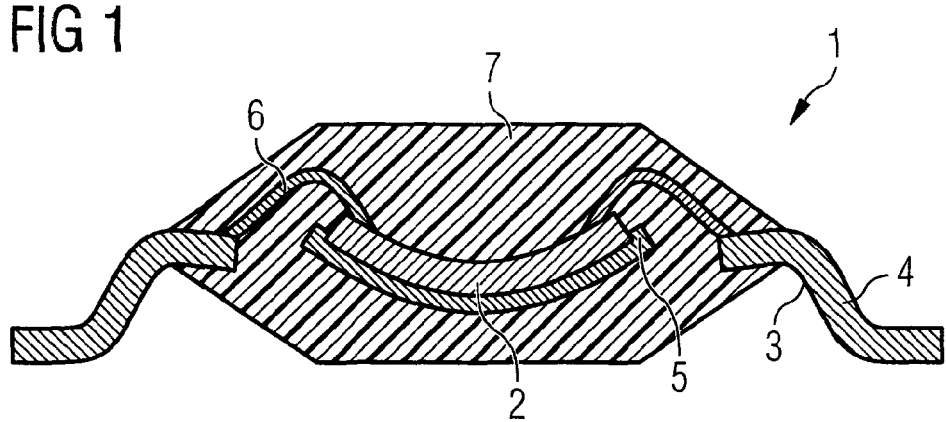
FIG. 1 schematically illustrates a semiconductor component according to a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention is to provide a semiconductor substrate having areas composed of stressed material, which allows considerably shorter switching times than in the case of the prior art.

A further embodiment of the present invention is to provide a method which is as simple and cost-effective as possible for production of a semiconductor component having such a semiconductor substrate.

According to one embodiment of the present invention, a semiconductor substrate composed of a monocrystalline material with a crystal structure K has one or more areas with an extrinsic, permanent curvature. The crystal structure K is compressed and/or widened and/or distorted in these areas.

The curvature can be induced by a mechanical process, for example a bending process or similar deformation, so that the semiconductor substrate has areas bent out from a plane. The curvature is induced permanently, which means that the semiconductor substrate is fixed after the introduction of the curvatures or stresses such that the curvatures or stresses remain permanently. These result in a locally modified lattice constant and/or distortion of the crystal structure in the curved areas.

The semiconductor substrate is thus, for example, not planar but is intrinsically bent or curved. It can be bent uniformly about one of its axes of symmetry so that it is in the form of a cylindrical casing segment, and the surfaces of the semiconductor substrate form surfaces with coaxial circle segments as a cross section. If, in contrast, it is bent about an axis parallel to one of its axes of symmetry, the surfaces of the semiconductor substrate represent surfaces with coaxial spiral segments as a cross section. The semiconductor substrate may, however, also be bent about more than one axis, and may have a less regular shape.

The invention is in this case based on the idea that complex processes such as epitaxy should be avoided for production of stresses in the material. Different materials, for example silicon, have only a low level of plastic deformation capability. This characteristic can be used deliberately in that the forces which are applied during bending of the material are converted to compression and/or widening and/or distortion of the crystal structure, and thus to local changes in the lattice constant, and/or to local distortion of the crystal structure.

The semiconductor substrate according to the invention has the advantage that it can have layers of stressed material of virtually any desired thickness. Furthermore, the semiconductor substrate is very robust and can be heated and processed in subsequent process steps without any problems, without displacements occurring in the material.

A semiconductor substrate such as this can be produced from various semiconductor materials. The crystal structure may be a diamond structure or a zinc blende structure. By way of example, silicon may be used as the monocrystalline material, although other monocrystalline materials are also feasible, in particular compound semiconductors.

The semiconductor substrate typically has a <100> or <111> orientation.

The semiconductor substrate may be subjected to further processing, in which, for example, it is provided with passivation layers, interconnect structures and/or external contacts, and is processed to form a semiconductor chip. The semiconductor substrate may in this case have virtually any desired thickness, and may have heavily stressed layers. A considerably shorter switching time can thus be achieved with the semiconductor chip.

The semiconductor chip can be arranged on a mounting substrate, and can be connected to it via electrical contacts, for example via bonding wires or flip-chip contacts, for use in a semiconductor component. Various substrates may be used as the mounting substrate, in particular lead frames and interposer substrates.

A semiconductor component with one or more semiconductor chips according to the invention may have a lead frame with an internal lead and external leads. In this case, the internal lead is curved, to be precise such that the semiconductor chip according to the invention can be arranged such that it fits accurately on it. The semiconductor chip is electrically connected to the external leads.

An interposer substrate can also be provided as the mounting substrate. One or more spacers may be arranged between the interposer substrate and the semiconductor chip, to produce or assist the curvature of the semiconductor chip. Flip-chip contacts can also be provided, with different thicknesses, by means of which the semiconductor chip is electrically connected to the mounting substrate, and which at the same time produce or assist the curvature of the semiconductor chip.

Furthermore, the invention relates to a method for production of a semiconductor component having at least one semiconductor chip which has a semiconductor substrate. First of all, in this case, a semiconductor chip is provided with areas composed of a monocrystalline material, for example silicon or a compound semiconductor. In addition, a mounting substrate is provided for holding the semiconductor chip, for example an interposer substrate or a lead frame.

The semiconductor chip is then fitted to the substrate, with the semiconductor chip being deformed in such a manner that stresses are introduced into the semiconductor substrate and induce areas with compressions and/or widenings and/or distortion of the crystal lattice in the semiconductor substrate. The semiconductor chip is fixed on the mounting substrate such that its deformation and thus the areas with deformed crystal structure remain permanently.

In this case, the curvature of the semiconductor chip, which results in the desired stressing of the material, may have been produced even before the semiconductor chip is mounted on the substrate, or else may be produced only while it is being mounted there. The semiconductor chip can intrinsically be bent uniformly and may be in the form of a cylindrical casing segment, although it could also be bent or shaped in some other manner.

This method has various advantages. It allows stresses to be introduced very easily, quickly and at low cost into the semiconductor substrate, for example by means of a mechanical process such as bending of the semiconductor chip. Highly complex and time-consuming processes such as epitaxy and in particular the extremely costly epitaxial growth of stressed layers on "silicon on glass" substrates are not necessary. Different, major, local distortion of the crystal lattice can be achieved by shaping of the semiconductor chip.

One particularly important advantage is that the method according to the invention can be used to produce stressed areas of virtually any desired thickness and major stressing, without displacement. This is because major stresses in material layers which are thicker than only a few monolayers allow a considerable reduction in the switching times of the semiconductor chip.

Silicon is used as the material for the semiconductor chip, or at least for parts of the semiconductor chip. Because silicon cannot be plastically deformed in practice, the semiconductor chip can be deformed virtually as far as brittle fracture, and can in this way be provided with highly stressed areas.

The semiconductor chip has a large number of connections, which are electrically connected via bonding wires or flip-chip contacts to connections on the mounting substrate. In this case, the desired shape of the semiconductor chip can be achieved very easily by the electrical connection of the semiconductor chip with the mounting substrate by means of flip-chip contacts of different thickness. While the semiconductor chip is being soldered on and while the solder is solidifying, the semiconductor chip is then drawn locally closer to the mounting substrate by means of the contacts of different thickness, and is intrinsically shaped in the process.

By way of example, the semiconductor chip may be fitted to a lead frame. For this purpose, the internal lead of the lead frame is bent in advance with the desired curvature—for example as a circle segment—so that the semiconductor chip matches this curvature during the process of mounting it on the internal lead. The semiconductor chip may, however, also be bent or shaped in some other way before being mounted there.

A bonding tool is used to press the semiconductor chip onto the prebent internal lead, and is shaped as a mating piece to the curved internal lead. This makes it possible to achieve particularly good matching between the semiconductor chip and the internal lead.

The semiconductor chip can also be fitted to an interposer substrate. In order to achieve the desired curvature of the semiconductor chip, spacers are arranged on the interposer substrate, and are located between the semiconductor chip and the interposer substrate once the semiconductor chip has been fitted. These spacers act in a similar manner to flip-chip contacts of different thickness and hold the semiconductor chip locally at a greater distance from the interposer substrate, so that the desired curvature can be forced on the semiconductor chip during connection to the interposer substrate.

The method according to the invention first makes it possible to stress the semiconductor substrate using simple mechanical means. In this case, the process for introduction of the stresses can be carried out while the semiconductor chip is being fitted to a substrate, that is to say in one step with the fitting of the semiconductor chip. It is thus particularly time-saving. There is therefore no need for technically complex epitaxy processes, whose use is furthermore subject to narrow limits because of the formation of displacements. The semiconductor component 1 illustrated in FIG. 1 has a semiconductor chip 2 which is arranged on an internal lead 5 of a lead frame 3 and is electrically connected via bonding wires 6 to an external lead 4 on the lead frame 3. The semiconductor chip 2, the internal lead 5, the bonding wires 6 and parts of the external lead 4 are surrounded by a plastic housing 7.

Neither the internal lead 5 nor the semiconductor chip 2 is completely planar, but they have a curvature which has been produced by a bending process.

Since the semiconductor chip 2 is composed of a monocrystalline material, for example of silicon, the bending process not only results in the macroscopic curvature of the semiconductor chip 2 but also in microscopic stressing of the monocrystalline chip material, which leads to local changes in the lattice constant. In areas in which the material is stretched, the lattice constant is increased, and in areas in which the material is compressed, it is reduced.

Since the macroscopic bending of the semiconductor chip 2 forces the material to carry out the microscopic changes of the lattice constant, and thus, so to speak, to be stressed, the geometry of the stresses in the material follows the curvature of the semiconductor chip 2.

In the exemplary embodiment illustrated in FIG. 1, the internal lead 5 is prebent to the desired shape before the semiconductor chip 2 is fitted. The semiconductor chip 2, which may be already bent or may still be flat, is then fitted to the curved internal lead 5, and is pressed on with the assistance of a bonding tool, which is not illustrated but is shaped as a mating piece to the prebent internal lead 5.

Electrical connections are then produced via bonding wires 6 between the semiconductor chip 2 and the external lead 4, and the semiconductor chip 2 is surrounded by a plastic housing 7.

Figure 2:
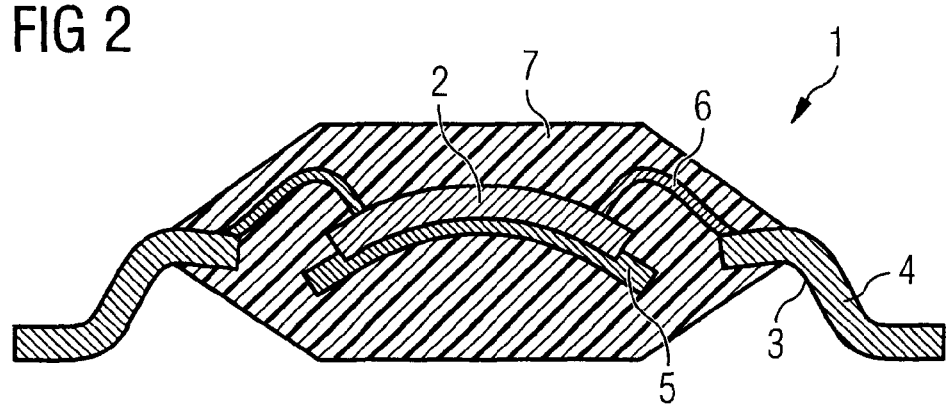
FIG. 2 schematically illustrates a semiconductor component according to a second embodiment of the invention.

Depending on the requirements for the microscopic characteristics of the semiconductor chip 2, in particular for the local lattice separation, the semiconductor chip 2 may be bent in different ways. One option is illustrated in FIG. 1, and a further is illustrated in FIG. 2. However, other curvatures, including non-uniform curvatures with more complicated geometries, are also feasible.

The choice of the curvature makes it possible to set the local characteristics of the semiconductor chip 2 particularly easily and flexibly. There is no need for complex processes such as epitaxial growth of stressed crystal layers.

This therefore also avoids further disadvantages of epitaxial layers: as a result of the bending of the semiconductor chip 2, the crystal lattice can be influenced in layers of virtually any desired thickness and can be provided with very high stresses. Both the layer thickness and the stress levels are, however, subject to narrow limits in the case of epitaxial processes.

Figure 3:
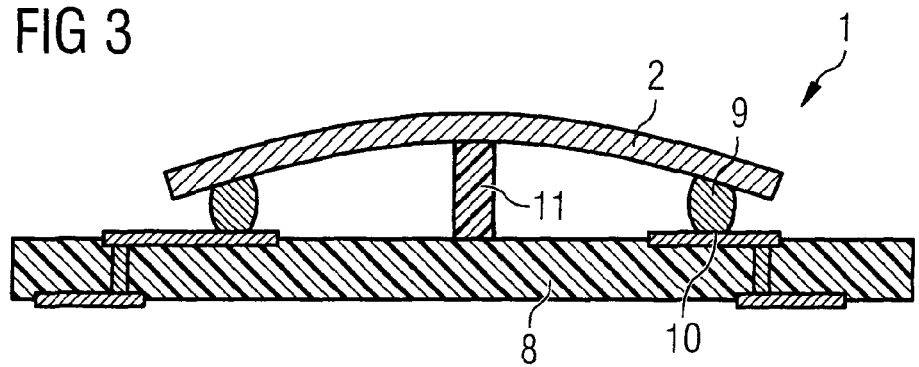
FIG. 3 schematically illustrates a semiconductor component according to a third embodiment of the invention.

Instead of being fitted to a lead frame 3, the semiconductor chip 2 can also, as is illustrated in FIG. 3, be fitted to an interposer substrate 8, and can be electrically connected by means of flip-chip contacts 9 to contact pad surfaces 10 on the interposer substrate 8.

The desired curvature of the semiconductor chip 2 as illustrated in FIG. 3 is achieved by means of a spacer 11, which is arranged between the interposer substrate 8 and the semiconductor chip 2. This supports the semiconductor chip 2, and holds it in the curved position. The level of curvature can be adjusted by means of the length of the spacer 11. The spacer 11 may be composed of an electrically insulating material, or else of a conductive material. In the latter case, it may be used as an additional contact.

Figure 4:
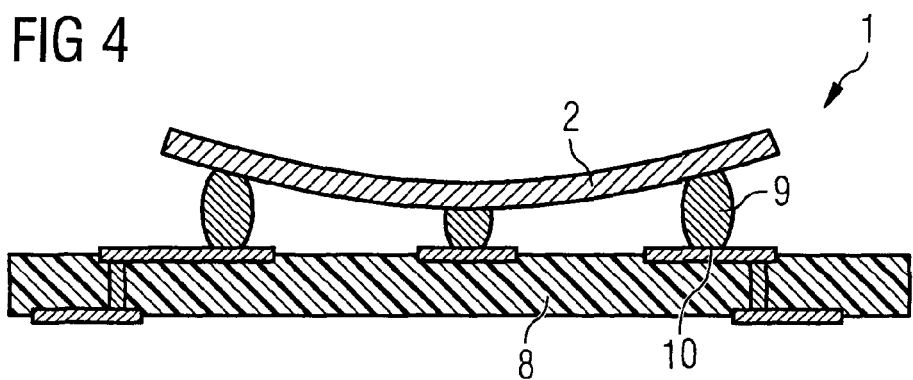
FIG. 4 schematically illustrates a semiconductor component according to a fourth embodiment of the invention.
Figure 5:
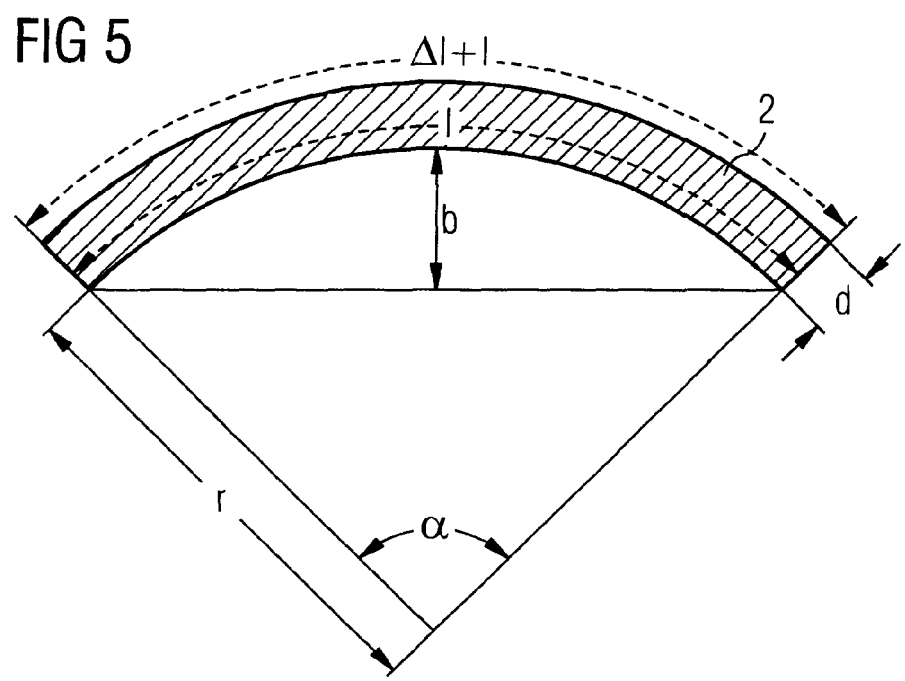
FIG. 5 schematically illustrates a semiconductor substrate which has been bent to form a cylindrical casing segment.

Instead of a spacer 11, the curved semiconductor chip 2 may also be supported by flip-chip contacts 9 of different thickness. FIG. 4 illustrates a semiconductor chip 2 which is connected to the interposer substrate 8 via a plurality of flip-chip contacts 9 of different thickness.

Instead of solder balls, solder columns can in some cases also be used to produce the flip-chip contacts 9. This makes it possible to provide flip-chip contacts 9 of different thickness, which hold the semiconductor chip 2 in its curved position after it has been mounted on the interposer substrate 8 by soldering it on.

Solder columns may comprise an approximately cylindrical part composed of high-melting-point copper which, for example, can be electrochemically deposited, and a cap composed of a solder deposition, via which the electrical and mechanical connections are made. Solder columns generally have the advantage that, for the same height, they have a smaller diameter than solder balls, and thus allow a greater connection density.

The present invention as illustrated in FIG. 4 additionally makes use of the fact that solder columns can be produced very easily in different heights, and are thus very highly suitable for setting the desired curvature of the semiconductor chip 2.

The semiconductor component 1 according to the invention allows considerably shorter switching times than conventional components, because the semiconductor chip 2 has crystal lattice distortion introduced by bending, and this leads to higher mobility of the charge carriers.

Nowadays, with epitaxial SiGe layers with 80% silicon and 20% germanium, which are grown on a silicon substrate, expansions and compressions of the lattice structure with a lattice constant that has been changed by $\Delta l/l \approx 1\%$ are achieved, where 1 is a characteristic length, for example referring to the lattice constant.

In order to achieve an equally strong effect in a semiconductor component according to the invention by deformation of the semiconductor substrate, the semiconductor chip 2 can be bent to form a cylindrical casing segment, so that its cross section forms a circular path, as illustrated in FIG. 3.

The calculation:

$$\frac{\Delta l}{l} = \frac{2\pi\left(r + \frac{d}{2}\right) - 2\pi r}{2\pi r} = \frac{d}{2r}$$

yields a bending radius r of 5.4 mm for a chip thickness d of 100 μm and a chip length 1 of 4 mm. With the modulus of elasticity E of silicon, which, in this case, owing to the anisotropy of the crystal structure can be estimated only in terms of the order of magnitude correctly to be E≈100 GPa, the maximum lateral contraction stress L that occurs can be calculated from this as follows:

$$L = \frac{dr}{2}E \approx 3 \text{ MPa}$$

It is thus considerably less than the ultimate fracture stress of the silicon of about 300 MPa. If d<<r, the aperture angle α is approximately 42°, and the bending is thus b 350 µm.

By way of example, bending b such as this can be achieved easily for the mounting of the semiconductor chip on a mounting substrate. If the chip frequencies d are greater and the bending radii r are smaller, even greater stresses can be achieved in a simple manner without reaching the ultimate fracture stress of silicon.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   at least one semiconductor chip comprising a semiconductor substrate having a monocrysalline material having a crystal structure K, and the semiconductor substrate having one or more areas with an extrinsic, permanent curvature, and the crystal structure K being compressed and/or widened and/or distorted in these areas; and
   a mounting substrate for holding the semiconductor chip, having bonding wires electrically connecting the semiconductor chip to the mounting substrate.

2. A semiconductor component comprising:
   at least one semiconductor chip comprising a semiconductor substrate having a monocrystalline material having a crystal structure K, and the semiconductor having one or more areas with an extrinsic, permanent curvature, and the crystal structure K being compressed and/or widened and/or distorted in these areas; and
   a mounting substrate for holding the semiconductor chip, having flip-chip contacts electrically connecting the semiconductor chip to the mounting substrate.

3. The semiconductor component according to claim 1, the mounting substrate comprising a lead frame.

4. The semiconductor component according to claim 3, comprising wherein the lead frame has a curved internal lead and external leads, and the semiconductor chip is arranged on the curved internal lead.

5. A semiconductor component comprising:
   at least one semiconductor chip comprising a semiconductor substrate having a monocrystalline material having a crystal structure K, and the semiconductor substrate having one or more areas with an extrinsic, permanent curvature, and the crystal structure K being compressed and/or widened and/or distorted in these areas; and
   a mounting substrate for holding the semiconductor chip comprising an interposer substrate.

6. The semiconductor component according to claim 5, comprising arranging one or more spacers between the semiconductor chip and the interposer substrate.

7. The semiconductor component according to claim 2, comprising at least some of the flip-chip contacts having different thicknesses.

8. A method for production of a semiconductor component having at least one semiconductor chip with a semiconductor substrate, comprising:
   providing a semiconductor chip with areas composed of a monocrystalline material with a crystal structure K;
   providing a mounting substrate;
   fitting the semiconductor chip to the mounting substrate, with the semiconductor chip being deformed in such a manner that stresses are introduced into the semiconductor substrate which result in areas with compressions and/or widened areas and/or distortion of the crystal structure K in the semiconductor substrate; and
   fixing of the deformed semiconductor chip in such a manner that the stresses which have been introduced permanently compress and/or widen and/or distort the crystal structure K.

9. The method according to claim 8, comprising electrically connecting the semiconductor chip to the mounting substrate via bonding wires.

10. The method according to claim 8, comprising electrically connecting the semiconductor chip to the mounting substrate via flip-chip contacts.

11. The method according to claim 10, comprising adjusting the desired curvature of the semiconductor chip via the electrical connection of the semiconductor chip to the mounting substrate by means of flip-chip contacts of different thickness.

12. The method according to claim 8, comprising using a lead frame as the mounting substrate.

13. The method according to claim 12, comprising wherein the lead frame has a curved internal lead and external leads, and comprising arranging the semiconductor chip on the curved internal lead of the lead frame, and electrically connecting the semiconductor chip to external leads of the lead frame.

14. The method according to claim 13, comprising using a bonding tool, which is in the form of a mating piece to the curved internal lead, for pressing on the semiconductor chip for arrangement of the semiconductor chip on the curved internal lead resulting in the semiconductor chip being bent to match the curvature of the internal lead.

15. The method according to claim 8, comprising using an interposer substrate as the mounting substrate.

16. The method according to claim 15, comprising arranging one or more spacers on the interposer substrate, and its or their heights is or are chosen such that it or they result in the setting of a desired curvature of the semiconductor chip.

* * * * *

UNITED STATES PATENT AND TRADEMARK OFFICE
CERTIFICATE OF CORRECTION

PATENT NO. : 7,566,585 B2 Page 1 of 1
APPLICATION NO. : 11/552702
DATED : July 28, 2009
INVENTOR(S) : Theuss It is certified that error appears in the above-identified patent and that said Letters Patent is hereby corrected as shown below:

Title Page, insert the following item

--(30) Foreign Application Priority Data

Oct. 25, 2005 (DE) ................................10 2005 051 332--.

Column 7, line 27, delete "monocrysalline" and insert in place thereof --monocrystalline--.

Signed and Sealed this

Tenth Day of November, 2009

David J. Kappos
*Director of the United States Patent and Trademark Office*